United States Patent
Cullen et al.

(10) Patent No.: US 7,521,987 B1
(45) Date of Patent: Apr. 21, 2009

(54) MULTIPLE SUPPLY VOLTAGE SELECT CIRCUIT FOR REDUCED SUPPLY VOLTAGE LEVELS

(75) Inventors: Edward Cullen, Abbeylands (IE); John G. O'Dwyer, Maynooth (IE); Jinsong Huang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/999,192

(22) Filed: Dec. 3, 2007

(51) Int. Cl.
*G11C 5/14* (2006.01)
(52) U.S. Cl. ...................................... 327/530; 327/407
(58) Field of Classification Search ................. 327/530, 327/427, 436, 403, 404, 407, 408
See application file for complete search history.

(56) References Cited

U.S. PATENT DOCUMENTS

| | | | | |
|---|---|---|---|---|
| 5,442,277 A | * | 8/1995 | Mori et al. | 323/312 |
| 6,479,974 B2 | * | 11/2002 | Cohn et al. | 323/312 |
| 6,578,185 B1 | * | 6/2003 | Kelly | 716/16 |
| 7,019,418 B2 | * | 3/2006 | Kakiuchi | 307/126 |

* cited by examiner

*Primary Examiner*—Lincoln Donovan
*Assistant Examiner*—Hai L. Nguyen
(74) *Attorney, Agent, or Firm*—W. Eric Webostad

(57) ABSTRACT

Multiple supply voltage select circuit for use with reduced supply voltage levels and method for using same are described. A first and second set of P-channel transistors are used for voltage pull-up at a common node using two supply voltages, respectively. A P-channel transistor from each of the sets is gated by output of a respective level shifter. Both of the level shifters are biased with a higher of the two supply voltages. First and second inputs are respectively provided to the level shifters and to gates of other P-channel transistors of each of the sets.

20 Claims, 2 Drawing Sheets

MULTIPLE SUPPLY VOLTAGE SELECT CIRCUIT FOR REDUCED SUPPLY VOLTAGE LEVELS

FIELD OF THE INVENTION

The invention relates to integrated circuit devices (ICs). More particularly, the invention relates to a multiple supply voltage select circuit for use with reduced supply voltage levels for an IC.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

FPGAs generally have several types of supply voltage input pins. For example, some FPGAs have VCCO, VCCAUX, and VCCINT as separate types of supply voltages that are provided from one or more external sources via external pins. VCCO is an externally provided supply voltage generally used to power output drivers. VCCAUX is an externally provided supply voltage generally used to power configuration memory, analog blocks, DCMs, and some I/O resources. VCCINT is an externally provided supply voltage, which is generally used to power programmable logic, including CLBs, of an FPGA, namely the "core logic" of an FPGA.

VCCO, VCCAUX, and VCCINT may have different logic high voltage levels. In a conventional FPGA, or other integrated circuit, with multiple supply voltages having different logic high voltage levels, level shifter circuits used N-channel transistors for pull-up voltages. A conventional level shifter circuit may include separate level shifters, where their outputs are respectively coupled to N-channel pull-up transistors. For example, for two level shifters in a level shifter circuit, there may be two N-channel pull-up transistors respectively coupled to the output of the two level shifters. One of these N-channel transistors was conventionally coupled to a voltage supply in a range of approximately 2.5 volts or higher, and the other of these N-channel transistors was conventionally coupled to a voltage supply in a range of approximately 1.0 to 1.2 volts.

Because N-channel transistors were used, they could selectively have their gates coupled to a ground potential to be put in a known state during a power-up operation, commonly known as a "power-on reset" (POR) cycle, as part of a voltage select circuit. Accordingly, such N-channel transistors during a POR cycle were in a state where there was no available channel for conduction, namely "completely shut-off."

In short, in a system with multiple logic high voltages, it was desirable to use N-channel transistors in a voltage select circuit, because their gates may be coupled to ground to ensure such N-channel transistors are completely shut-off during a POR cycle. With use of N-channel transistors, operation of such a voltage select circuit may be immune from uncertainties in voltage levels of supply voltages as they were powered up during a POR cycle.

In contrast to use of N-channel transistors, P-channel transistors are completely shut-off when their gates are biased to a logic high voltage level which precludes conductivity during a POR cycle. However, during a POR cycle for a system with multiple voltage levels, some supplies may power-up before others which may lead to an unacceptable condition. Thus, P-channel transistors heretofore were not a good choice as they were subject to uncertainties in voltage levels during a POR cycle.

More recently, operational logic high voltage levels have been reduced. For example, a voltage select circuit may have to accommodate differing supply voltages which are both less than 2 volts and which have a less than 0.5 volt difference between them. Unfortunately, conventional N-channel transistors in such voltage select circuits have thick gate dielectrics sufficient for allowing their gate voltages to be driven sufficiently high to allow NMOS to conduct, and thus such conventional N-channel transistors have correspondingly large threshold voltages. Because of the relative size of such threshold voltages of the N-channel transistors in comparison to the lowered supply voltage levels, such N-channel transistors may not be sufficiently conductive when their gates are biased with a logic high voltage level during operation after a POR cycle. In short, using N-channel transistors to implement switches means the control voltage is to be at least a threshold voltage above a channel voltage of such transistors, and this may be an issue when the threshold voltage of thick-oxide N-channel transistors is higher.

Accordingly, it would be desirable and useful to provide a voltage select circuit which overcomes one or more of the above-described limitations for operating with different supply voltage levels both of which are less than 2 volts.

SUMMARY OF THE INVENTION

One or more aspects of the invention generally relate to integrated circuit devices (ICs) and, more particularly, to a multiple supply voltage select circuit for use with reduced supply voltage levels for an IC.

An aspect of the invention relates generally to an output voltage select circuit. A control circuit is coupled to receive mode select signaling and configured to provide a first control signal, a second control signal, and a third control signal responsive at least in part to the mode select signaling. A first level shifter is coupled to receive the first control signal. A second level shifter is coupled to receive the second control signal. A first P-channel transistor is coupled to receive the first control signal at a gate node thereof and coupled to a first supply voltage at a source node thereof. A second P-channel transistor is coupled to receive the second control signal at a gate node thereof and coupled to a second supply voltage at a source node thereof. The first supply voltage and the second supply voltage during a non-power-on-reset operative condition have a first voltage level and a second voltage level which are operationally different from one another. A third P-channel transistor has a source node coupled to a drain node of the first P-channel transistor. A drain node of the third P-channel transistor is coupled to an output node. A gate node of the third P-channel transistor is coupled to receive an output from the first level shifter. A fourth P-channel transistor has a source node coupled to a drain node of the second P-channel transistor. A drain node of the fourth P-channel transistor is coupled to the output node. A gate node of the fourth P-channel transistor is coupled to receive an output from the first level shifter. An N-channel transistor coupled to receive the third control signal at a gate node thereof. A source node of the N-channel transistor coupled to a ground, the ground being at a third voltage level. A drain of the N-channel transistor is coupled to the output node. Output voltage at the output node is selectable as between the first voltage level, the second voltage level, and the third voltage level responsive to the first control signal, the second control signal, and the third control signal, respectively, during the non-power-on-reset operative condition. Only one of the first control signal, the second control signal, and the third control signal is asserted at a time during the non-power-on-reset operative condition. The output node is electrically decoupled from the first supply voltage, the second supply voltage, and the ground during a power-on-reset operative condition responsive to a power-on reset signal.

Another aspect of the invention relates generally to a method for selectable provisioning of an output voltage. A select signal is a received to a control circuit. A first control signal, a second control signal, and a third control signal are output from the control circuit responsive at least to the select signal. The first control signal is input to a first level shifter. The second control signal is input to a second level shifter. A first P-channel transistor is gated with the first control signal. A second P-channel transistor is gated with a first output from the first level shifter. A first supply voltage is first passed via the first P-channel transistor and the second P-channel transistor coupled in series to an output node when in a first operational mode responsive to a first condition. A third P-channel transistor is gated with the second control signal. A fourth P-channel transistor is gated with a second output from the second level shifter. A second supply voltage is second passed via the third P-channel transistor and the fourth P-channel transistor coupled in series to the output node when in the first operational mode responsive to a second condition. The first supply voltage has a first voltage level and the second supply voltage has a second voltage level, wherein the first voltage level and the second voltage level are operationally different from one another. An N-channel transistor is gated with the third control signal. A ground potential is third passed via the N-channel transistor to the output node when in the first operational mode responsive to a third condition. One of the first voltage level, the second voltage level, and the ground potential is electrically coupled to the output node responsive to the first control signal, the second control signal, and the third control signal, respectively, during the first operational mode, wherein only one of the first control signal, the second control signal, and the third control signal is asserted at a time during the first operational mode. Coupling of the output node to any of the first supply voltage, the second supply voltage, and the ground potential during a second operational mode is electrically prevented responsive to a fourth control signal.

Yet another aspect of the invention relates generally to a supply voltage select circuit. A first set of P-channel transistors and a second set of P-channel transistors are used for voltage pull-up at a common output node. The first set of P-channel transistors is associated with a first supply voltage, and the second set of P-channel transistor is associated with a second supply voltage. The first supply voltage is targeted for a higher voltage level than the second supply voltage. A first P-channel transistor of the first set of P-channel transistors is gated with a first output of a first level shifter. A first P-channel transistor of the second set of P-channel transistors is gated with a second output of a second level shifter. The first level shifter and the second level shifter are each biased with the first supply voltage. A first input is provided as an input to the first level shifter and is provided to gate a second P-channel transistor of the first set of P-channel transistors. A second input provided as an input to the second level shifter and provided to gate a second P-channel transistor of the second set of P-channel transistors.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
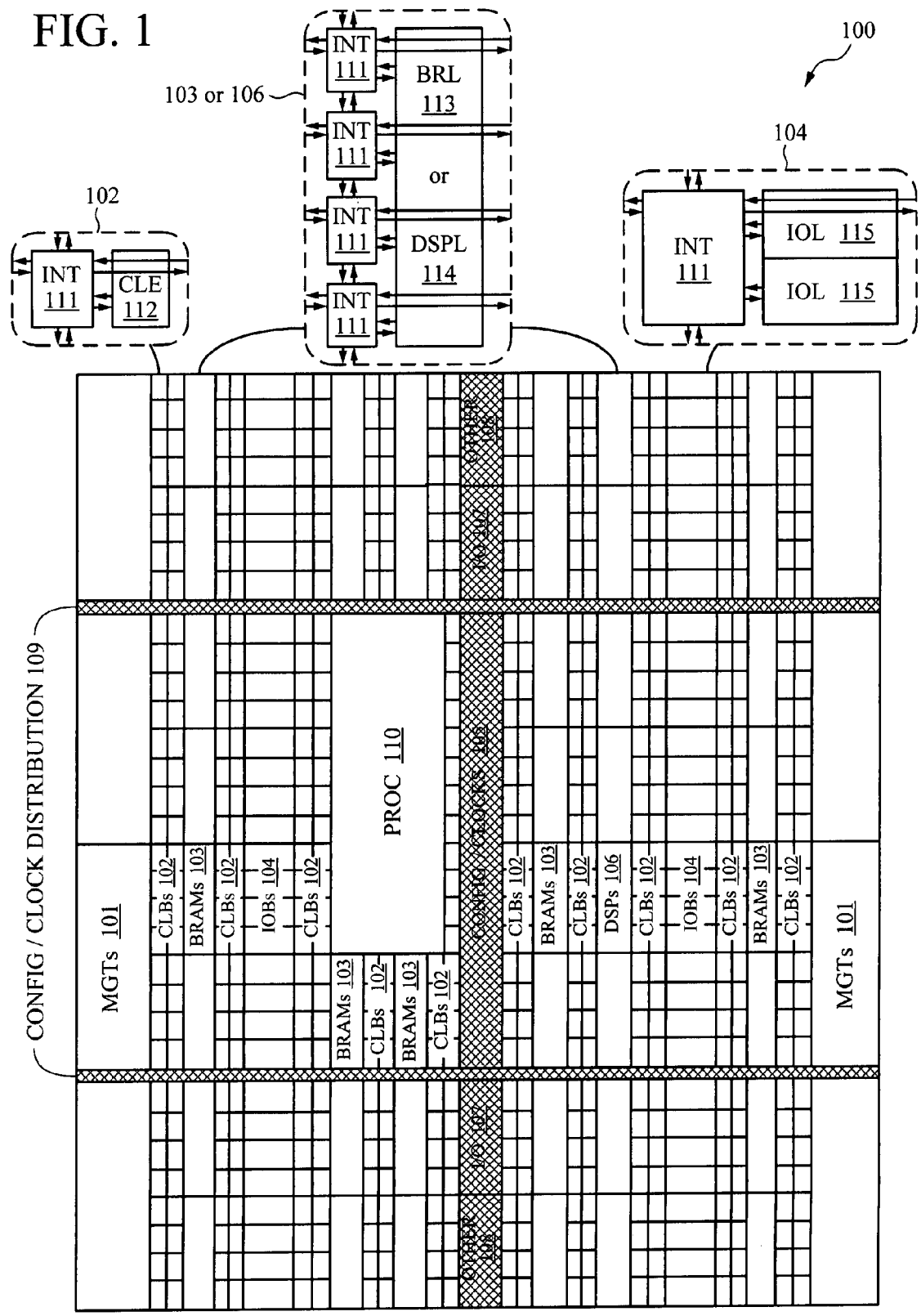
FIG. 1 is an exemplary embodiment of a field programmable gate array (FPGA) architecture that includes a large number of different programmable tiles.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block PROC 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Although FIG. 1 represents a Virtex-4™ from Xilinx, Inc. of San Jose, Calif., other FPGAs, such as for example Spartan™-3A generation FPGAs from Xilinx, Inc. of San Jose, Calif., may be used.

Figure 2:
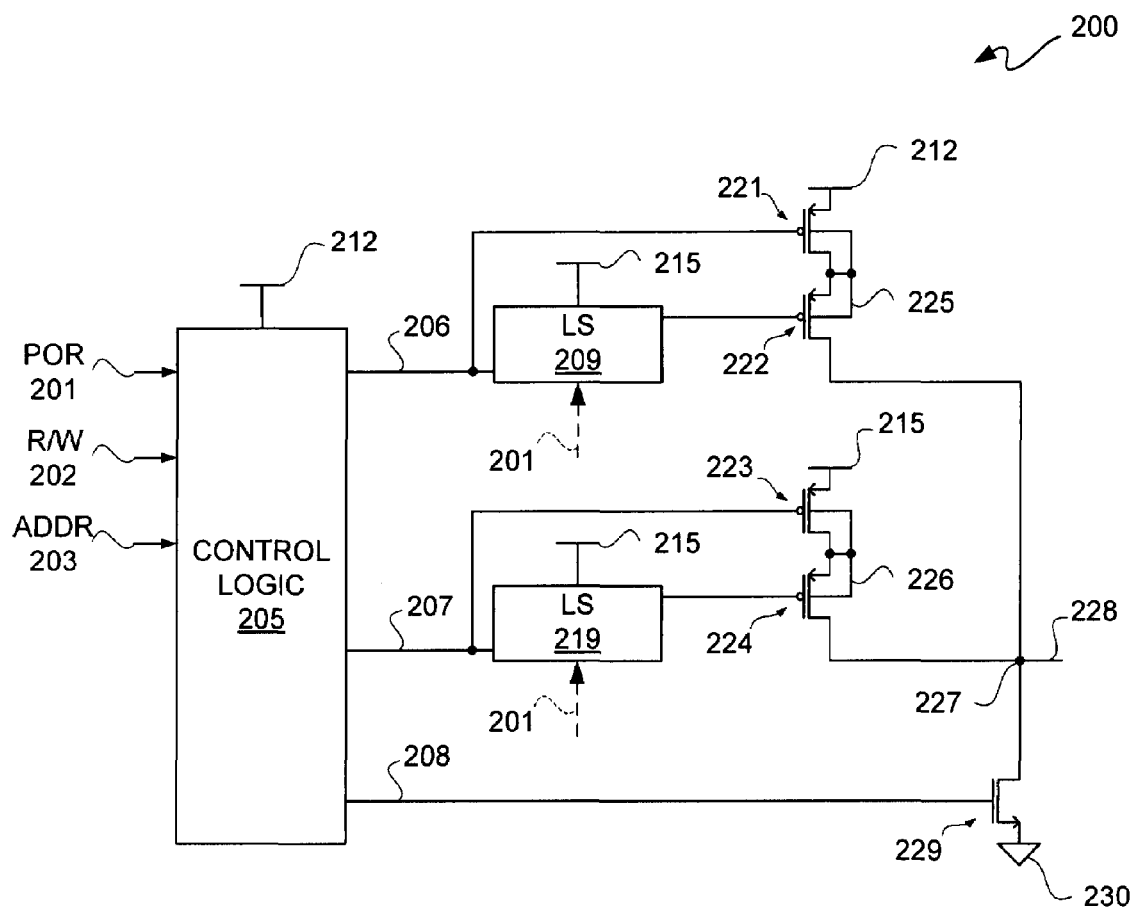
FIG. 2 is a block/circuit diagram depicting an output voltage select circuit in accordance with an embodiment of the present invention.

FIG. 2 is a block/circuit diagram depicting an exemplary embodiment of an output voltage select circuit 200. Output voltage select circuit 200 is for outputting one of a plurality of outputs, which plurality of outputs includes at least two logic high voltage levels.

Output voltage select circuit 200 includes control logic 205, level shifter 209, level shifter 219, P-channel transistor 221, P-channel transistor 222, P-channel transistor 223, P-channel transistor 224, and N-channel transistor 229.

Control logic 205 is coupled to receive control signaling and configured to provide control signals. More particularly, control logic may receive a power-on reset ("POR") signal 201.

Control logic 205 is coupled to receive a POR signal 201 and voltage select signaling. Voltage select signaling may include a read/write toggle signal, such as R/W signal 202 for toggling between a read condition and a write condition. Of note, voltage output at output node 227, namely output voltage 228, may be higher for a write mode of operation than for a read mode of operation. Output voltage 228 may be provided for example to configuration memory cells associated with CLBs 102 of FIG. 1. Optionally, control logic 205 may include stored addresses for selecting a control signal to output. Accordingly, an address signal 203 may be provided to control logic 205. These are just some examples of control signals that may be provided, and other control signals may be used in accordance with the description herein.

Control logic 205 is powered by supply voltage 212. Level shifters 209 and 219 are powered by supply voltage 215. For purposes of clarity by way of example and not limitation, supply voltage 212 is assumed to have a logic high voltage of 1.2 volts and supply voltage 215 is assumed to have a logic high voltage of 1.5 volts. These target voltage values, or other target voltage values both of which are less than approximately 2 volts, may be used. Furthermore, it should be appreciated that there may be some variation in supply voltages 212 and 215. For example, supply voltage 212 may vary from approximately 0.96 to 1.44 volts, and supply voltage 215 may vary from approximately 1.35 to 1.65 volts.

Assuming for now that a POR cycle has completed, operation of output voltage select circuit 200 is described for a non-POR condition. It shall be assumed that address select signal 203 is provided for selecting a write address, and R/W enable signal 202 is for a write operation. For such control input to control logic 205, read control signal 206 and idle control signal 208 are inactive, which in this example means that read control signal 206 is at a logic high level and idle control signal 208 is at a logic low level. Thus, for selecting output voltage 228 for providing a write logic high level output, write control signal 207 is active, which in this example means at a logic low state.

Control logic 205 outputs read control signal 206, write control signal 207, and idle control signal 208. Read control signal 206 is provided to an input port of level shifter 209 and to a gate of P-channel transistor 221. A source of P-channel transistor 221 is coupled to receive supply voltage 212. A drain of P-channel transistor 221 is coupled to a source of P-channel transistor 222. A gate of P-channel transistor 222 is coupled to receive output from level shifter 209. A drain of P-channel transistor 222 is coupled to output node 227.

P-channel transistors 221 and 222 may have their body regions in a common N-type substrate or N-well 225. N-well 225 may be coupled at the drain-source series coupling of P-channel transistors 221 and 222. When P-channel transistor 221 is in a substantially conductive state, P-channel transistors 221 and 222 are back body biased by supply voltage 212 to enhance or help transition and maintain P-channel transistors 221 and 222 in a substantially conductive state, namely a stronger "ON" condition owing to the coupling at a center node, namely N-well 225.

Write control signal 207 output from control logic 205 is provided to an input port of level shifter 219 and to a gate of P-channel transistor 223. P-channel transistor 223 is coupled in drain-source series with P-channel transistor 224. A source node of P-channel transistor 223 is coupled to supply voltage 215, and a drain of P-channel transistor 224 is coupled to output node 227. A gate of P-channel transistor 224 is coupled to an output port of level shifter 219. P-channel transistors 223 and 224 may have a common N-type substrate or N-well 226. N-well 226 may be coupled at the drain-source series coupling of P-channel transistors 223 and 224, for reasons as previously described with reference to N-well 225 coupling of P-channel transistors 221 and 222.

Idle control signal 208 is provided to a gate of N-channel transistor 229. A source of N-channel transistor is coupled to ground 230. A drain of N-channel transistor 229 is coupled to output node 227.

In operation for a non-POR condition, only one of control signals 206 through 208 is active at a time. Assuming control signal 206 is active, meaning a read logic high voltage level is to be provided as output voltage 228 at output node 227, then both of control signals 206 and 208 are at logic low states, and control signal 207 is at a logic high state. This assumes of course that R/W select signal 202 was for a read, and address select signal 203 indicated an address for activating read control signal 206.

For a read condition with read control signal 206 being in a logic low state, output of level shifter 209 is logic low, and both of P-channel transistors 221 and 222 are in a substantially conductive state. Of note, the full extent of a logic high voltage level of supply voltage 212 may be coupled to output node 227 for providing output voltage 228.

For a read condition, write control signal 207 is logic high and thus output of level shifter 219 is logic high. Accordingly, P-channel transistors 223 and 224 are in substantially nonconductive states. Furthermore, because the logic high level of write control signal 207 is that of supply voltage 212, level shifter 219, in supplying an output to the gate of P-channel transistor 224, outputs a higher level than that of supply voltage 212, namely a supply voltage level associated with supply voltage 215. This ensures at least a substantially nonconductive state, if not a fully nonconductive state, of P-channel transistor 224 to reduce or eliminate supply voltage-to-supply voltage coupling as between supply voltages 215 and 212.

For a read condition, idle control signal 208 is a logic low, and thus N-channel transistor 229 is in a substantially nonconductive state. With respect to an FPGA implementation, supply voltage 212 may be thought of as a VCCINT or VDD. Furthermore, supply voltage 215 may be a stepped down voltage from VCCAUX. Accordingly, it should be appreciated that after a POR condition, only one of control signals 206 through 208 is active at a time, and thus the likelihood of supply-to-supply current leakage or supply-to-ground current leakage is substantially reduced or eliminated.

For a write condition, read control signal 206 and idle control signal 208 are inactive, namely logic high and logic low, respectively, and write control signal 207 is active, namely logic low. For a write condition, N-channel transistor 229 is in a substantially nonconductive state as previously described. Accordingly, level shifter 209 outputs a logic high which is a logic high of supply voltage 215, for at least placing P-channel transistor 222 in a substantially nonconductive, if not a fully nonconductive, state. Furthermore, P-channel transistor 221 is at least substantially nonconductive.

For a write condition, a logic low value for write control signal 207 is input to level shifter 219 and to a gate of P-channel transistor 223. Accordingly, output of level shifter 219 is a logic low, and thus both of P-channel transistors 223 and 224 are substantially conductive for coupling supply voltage 215 to output node 227. Of note, supply voltage 215 may be fully coupled to output node 227, as described below in additional detail.

It should be appreciated that P-channel transistors 221 through 224 need not be thick oxide transistors conventionally associated with an NMOS only implementation (with use of NMOS supply transistors). The ability to use P-channel transistors with thinner oxides facilitates lower threshold voltage operation. A lower threshold voltage may perform more consistently across changes in process-voltage-temperature ("PVT"). For clarity, it should be understood that generally use of a lower threshold voltage is not what makes voltage select circuit 200 less sensitive to PVT variation, rather use of P-channel transistors to implement switches instead of N-channel transistors generally makes voltage select circuit 200 less sensitive to PVT variation.

Furthermore, the ability to operate with lower threshold voltages as associated with thinner oxide transistors facilitates that supply voltages may be lower, such as both below 2 volts, and still obtain logic high voltage levels at output node 227. In other words, if a threshold voltage was too large in comparison to a supply voltage level, the logic high level voltage at 227 may not reach the supply voltage level. For purposes of clarity by way of example and not limitation, it shall be assumed that the threshold level voltages (voltage levels) for output voltage 228 are 1.2 volts for a read operation and 1.5 volts for a write operation. However, it should be appreciated that other values, including those previously mentioned herein, may be used.

During a power-up or POR condition, output voltage 228, or more particularly, output at node 227, is floating. In other words, output voltage select circuit 200 has an output voltage 228 which is of a tri-state condition. In order for such a condition to exist, neither of supply voltages 212 or 215 may be electrically coupled to output node 227 during a POR condition. Additionally, ground 230 may not be electrically coupled to output node 227 during a power-up or POR condition.

For a POR condition, POR signal 201 is asserted. POR signal 201 is provided to control logic 205. Alternatively, POR signal 201 may be provided directly to level shifters 209 and 219 such that their outputs are logic high, as indicated by dashed lines for POR signal input to level shifters 209 and 219 in FIG. 2. However, for purposes of clarity by way of example and not limitation, it shall be assumed that POR signal 201 is not directly provided to level shifters 209 and 219.

By the end of a POR cycle, control signals 206 and 207 should be at logic high levels, and idle control signal 208 should be at a logic low level. However, initially in a POR condition, supply voltages may be approximately zero volts. Thus, while it is possible to provide idle control signal 208 at a logic low level initially during a POR cycle, such as by a coupling to a ground potential 230, control signals 206 and 207 may both initially be at logic low levels, such as approximately zero volts at the initial portion of a POR cycle. Thus, initially during a POR condition, output of level shifters 209 and 219 may be at logic low levels.

Figure 3:
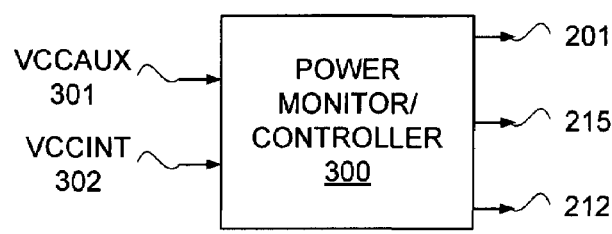
FIG. 3 is a block diagram depicting a power monitor/controller in accordance with an embodiment of the present invention.

FIG. 3 is a block diagram depicting an exemplary embodiment of a power monitor/controller 300. Circuitry for implementing power monitor/controller 300 is known, so is not described in unnecessary detail.

An external power supply, conventionally referred to as VCCAUX 301, is used to provide a first external voltage. Another external power supply, conventionally known as VCCINT 302, is used to provide a second externally supplied voltage. Of note, the voltage levels of these two supplies may be substantially different. For example, the voltage level of VCCAUX 301 in many instances is more than twice that of VCCINT 302.

During a POR condition, power monitor/controller 300 identifies that voltage is being supplied by supplies 301 and 302 and asserts POR signal 201. While VCCINT 302 is passed through directly as supply voltage 212, VCCAUX 301 is stepped down to a lower voltage, namely supply voltage 215, and is delayed before being output from power monitor/controller 300.

Conventionally, power monitor/controller 300 delays allowing the passage of supply voltage 215 until after supply voltage 212 has reached approximately one-third of its target voltage level, which continuing the example above would be approximately 0.4 volts. After supply voltage 212 reaches approximately 0.4 volts, supply voltage 215 is allowed to ramp up, starting at 0 volts.

With renewed reference to FIG. 2 and continuing reference to FIG. 3, control logic 205 is supplied by supply voltage 212, and read control signal 206 and write control signal 207 are initially at for example 0 volts. From an initial voltage level, read control signal 206 and write control signal 207 ramp up together as they are both supplied by supply voltage 212. However, voltages output from level shifters 209 and 219 ramp up differently than voltages supplied by supply voltage 215, responsive to the delay as previously described with respect to power monitor/controller 300 in providing a ramp up of supply voltage 215.

Because P-channel transistor 221 is sourced by supply voltage 212, both the gate input and the source input to P-channel transistor 221 will follow the ramp up of supply voltage 212. This means that the gate voltage and the source voltage of P-channel transistor 221 will generally be the same, and thus P-channel transistor 221 remains in a substantially non-conductive state, unless its drain voltage is higher than its gate voltage.

In contrast, write control signal 207, which is being ramped up toward a logic high state for a POR condition, ramps up ahead of supply voltage 215. Accordingly, the gate voltage on P-channel transistor 223 leads the source voltage thereof. P-channel transistor 223 thus remains in a substantially non-conductive state. It should be appreciated that as control signals 206 and 207 ramp up toward a logic high level, outputs of level shifters 209 and 219, respectively, ramp toward such a logic high level, but this ramping may be delayed as level shifters 209 and 219 are powered using supply voltage 215. In other words, the outputs of level shifters 209 and 219 are indexed with respect to logic high levels to supply voltage 215.

However, even though supply voltage 215 eventually catches up with and exceeds the voltage level of supply voltage 212, supply voltages 212 and 215 will not be coupled to output node 227 during a POR condition. This is because control signals 206 and 207 will have ramped to sufficiently high levels such that level shifters 209 and 219, respectively, will output logic high levels. Thus, as supply voltage 215 ramps, the logic high inputs to level shifters 209 and 219 effectively further shutoff source-to-drain conductivity across P-channel transistors 222 and 224, respectively.

It should be appreciated that the delay in ramping supply voltage 215 is merely one example of how to prevent level shifters 209 and 219 from outputting a logic low to transition P-channel transistors 222 and 224 to substantially conductive states during a POR condition. As previously described, an alternative embodiment is to provide POR signal 201 directly to level shifters 209 and 219 to force or override output of level shifters 209 and 219 to provide logic high voltage levels, or more particularly to ramp logic high voltage levels immediately, for a POR condition.

It should be appreciated that it is not necessary that supply voltage 215 ramps up to a voltage level which is higher than supply voltage 212. In fact, in the example voltage ranges provided, it is possible to have supply voltage 215 at a lower voltage level than supply voltage 212. However, for an application where the higher voltage level is used to write to configuration memory of an FPGA, such higher voltage level is used to overcome a previous written state of configuration memory. Moreover, a lower supply voltage level 212 may be used so as not to disturb state of configuration memory already written. Thus, in some applications a more restrictive range of voltage may be appropriate.

Furthermore, supply voltage 212 need not reach its target voltage level prior to supply voltage 215 reaching its own target voltage level in the above example. In fact, the ramp time of supply voltage 215 to reach its target supply voltage level, such as 1.5 volts, may actually be shorter than the ramp time for supply voltage 212 to reach its target level, such as 1.2 volts in this example.

For example, if supply voltage 215 were to ramp faster than supply voltage 212, because supply voltage 212 has in effect a 0.4 volt head start it will be at a high enough voltage level before being passed by supply voltage 215. Thus, level shifters 209 and 219 may both still identify control signals 206 and 207 as logic high levels prior to supply voltage 215 being significantly higher than the voltage level of write control signal 207. In other words, the difference between supply voltage 215 and write control signal 207 may not be equal to or greater than one threshold voltage of P-channel transistor 223 prior to level shifter 219 outputting a sufficiently high voltage level for shutting off or maintaining P-channel transistor 224 in a substantially nonconductive state.

It should be understood that output voltage select circuit 200 may use thinner oxide transistors, when comparing the P-channels used in output voltage select circuit 200 as compared to prior art NMOS pull-up voltage circuits. Furthermore, the exact order of control and channel voltage power-up may be unknown, and still output voltage select circuit 200 provides a tri-stated output at output node 227. Thus, there is little to no opportunity for supply-to-supply or supply-to-ground leakage current. Furthermore, it should be appreciated that output voltage select circuit 200 during a POR condition need not have one target supply voltage be higher than another. In other words, the values may even reverse with respect to which is the highest logic level. Lastly, it should be appreciated that no separate or third voltage needs to be provided as a reference voltage for use of output voltage select circuit 200 during a POR condition.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An output voltage select circuit, comprising:
   a control circuit coupled to receive mode select signaling and configured to provide a first control signal, a second control signal, and a third control signal responsive at least in part to the mode select signaling;
   a first level shifter coupled to receive the first control signal;
   a second level shifter coupled to receive the second control signal;
   a first P-channel transistor coupled to receive the first control signal at a gate node thereof and coupled to a first supply voltage at a source node thereof;
   a second P-channel transistor coupled to receive the second control signal at a gate node thereof and coupled to a second supply voltage at a source node thereof;
   the first supply voltage and the second supply voltage during a non-power-on-reset operative condition having a first voltage level and a second voltage level which are operationally different from one another;
   a third P-channel transistor having a source node coupled to a drain node of the first P-channel transistor;
   a drain node of the third P-channel transistor coupled to an output node;
   a gate node of the third P-channel transistor coupled to receive an output from the first level shifter;
   a fourth P-channel transistor having a source node coupled to a drain node of the second P-channel transistor;
   a drain node of the fourth P-channel transistor coupled to the output node;
   a gate node of the fourth P-channel transistor coupled to receive an output from the first level shifter;
   an N-channel transistor coupled to receive the third control signal at a gate node thereof;
   a source node of the N-channel transistor coupled to a ground, the ground being at a third voltage level;
   a drain of the N-channel transistor coupled to the output node;
   output voltage at the output node selectable as between the first voltage level, the second voltage level, and the third voltage level responsive to the first control signal, the second control signal, and the third control signal, respectively, during the non-power-on-reset operative condition;
   only one of the first control signal, the second control signal, and the third control signal being asserted at a time during the non-power-on-reset operative condition; and
   the output node being electrically decoupled from the first supply voltage, the second supply voltage, and the ground during a power-on-reset operative condition responsive to a power-on reset signal.

2. The output voltage select circuit according to claim 1, wherein:
   both the first voltage level and the second voltage level are less than approximately 2 volts; and
   the first voltage level is capable of being different from the second voltage level by as much as approximately 0.69 volts.

3. The output voltage select circuit according to claim 1, wherein the first voltage level is in a range of approximately 0.96 to 1.44 volts; and wherein the second voltage level is in a range of approximately 1.35 to 1.65 volts.

4. The output voltage select circuit according to claim 1, wherein the control circuit is coupled to receive the power-on reset signal and is further configured to not assert any of the first control signal, the second control signal, and the third control signal responsive to the power-on reset signal.

5. The output voltage select circuit according to claim 1, wherein the first level shifter and the second level shifter are each coupled to receive the power-on reset signal.

6. The output voltage select circuit according to claim 1, wherein the first P-channel transistor and the third P-channel transistor each have a body region thereof disposed in a first common N-type region; and wherein the second P-channel transistor and the third P-channel transistor each have a body region thereof disposed in a second common N-type region, the first common N-type region being electrically separated from the second common N-type region.

7. The output voltage select circuit according to claim 6, wherein the first common N-type region is common to the drain node of the first P-channel transistor and the source node of the third P-channel transistor; and wherein the second common N-type region is common to the drain node of the second P-channel transistor and the source node of the fourth P-channel transistor.

8. The output voltage select circuit according to claim 1, wherein the first level shifter and the second level shifter are powered using the second supply voltage; and wherein the control circuit is powered using the first supply voltage.

9. A method for selectable provisioning of an output voltage, comprising:
   receiving a select signal to a control circuit;
   outputting from the control circuit a first control signal, a second control signal, and a third control signal responsive at least to the select signal;
   inputting the first control signal to a first level shifter;
   inputting the second control signal to a second level shifter;
   gating a first P-channel transistor with the first control signal;
   gating a second P-channel transistor with a first output from the first level shifter;
   first passing a first supply voltage via the first P-channel transistor and the second P-channel transistor coupled in series to an output node when in a first operational mode responsive to a first condition;
   gating a third P-channel transistor with the second control signal;
   gating a fourth P-channel transistor with a second output from the second level shifter;
   second passing a second supply voltage via the third P-channel transistor and the fourth P-channel transistor coupled in series to the output node when in the first operational mode responsive to a second condition;
   the first supply voltage having a first voltage level and the second supply voltage having a second voltage level, wherein the first voltage level and the second voltage level are operationally different from one another;
   gating an N-channel transistor with the third control signal;

third passing a ground potential via the N-channel transistor to the output node when in the first operational mode responsive to a third condition;

electrically coupling to the output node one of the first voltage level, the second voltage level, and the ground potential responsive to the first control signal, the second control signal, and the third control signal, respectively, during the first operational mode, wherein only one of the first control signal, the second control signal, and the third control signal is asserted at a time during the first operational mode; and electrically preventing coupling of the output node to any of the first supply voltage, the second supply voltage, and the ground potential during a second operational mode responsive to a fourth control signal.

10. The method according to claim 9, wherein the first level shifter and the second level shifter are each powered with the second supply voltage.

11. The method according to claim 10, wherein:
both the first voltage level and the second voltage level are less than approximately 2 volts; and
the control circuit is powered with the first supply voltage.

12. The method according to claim 9, further comprising allowing the first supply voltage to reach a threshold value prior to allowing the second supply voltage to be provided to the first level shifter, the second level shifter, and the third P-channel transistor.

13. The method according to claim 9, wherein the fourth control signal is a power-on reset signal; and wherein the second operational mode is a power-up mode.

14. The method according to claim 13, wherein the output node floats in the power-up mode.

15. The method according to claim 13, wherein the first condition is for a read from memory, the output node being electrically coupled to the first supply voltage for the first condition.

16. The method according to claim 15, wherein the second condition is for a write to memory, the output node being electrically coupled to the second supply voltage for the second condition; and wherein the second voltage level is operationally higher than the first voltage level.

17. The method according to claim 16, wherein the third condition is neither for the read from nor the write to the memory, the output node being electrically coupled to the ground potential for the third condition.

18. The method according to claim 17, wherein:
the first supply voltage is provided from a first external voltage source without having to be stepped down to provide the first voltage level; and
the second supply voltage is provided from a second external voltage source which is stepped down to provide the second voltage level.

19. A supply voltage select circuit, comprising:
a first set of P-channel transistors and a second set of P-channel transistors used for voltage pull-up at a common output node;
the first set of P-channel transistors associated with a first supply voltage;
the second set of P-channel transistor associated with a second supply voltage;
the first supply voltage being targeted for a higher voltage level than the second supply voltage;
a first P-channel transistor of the first set of P-channel transistors being gated with a first output of a first level shifter;
a first P-channel transistor of the second set of P-channel transistors being gated with a second output of a second level shifter;
the first level shifter and the second level shifter each being biased with the first supply voltage;
a first input provided as an input to the first level shifter and provided to gate a second P-channel transistor of the first set of P-channel transistors; and
a second input provided as an input to the second level shifter and provided to gate a second P-channel transistor of the second set of P-channel transistors.

20. The supply voltage select circuit according to claim 19, wherein the first supply voltage and the second supply voltage are both targeted to be less than 2 volts.

* * * * *